United States Patent
Yeung

(10) Patent No.: US 10,563,824 B2
(45) Date of Patent: Feb. 18, 2020

(54) SUBSTRATE USED FOR LED ENCAPSULATION, THREE-DIMENSIONAL LED ENCAPSULATION, BULB COMPRISING THREE-DIMENSIONAL LED ENCAPSULATION AND MANUFACTURING METHOD THEREFOR

(71) Applicant: SIM Lighting Design Company Limited, Hong Kong (CN)

(72) Inventor: Andrew Yeung, Hong Kong (CN)

(73) Assignee: SIM Lighting Design Company Limited, Hong Kong (CN)

( * ) Notice: Subject to any disclaimer, the term of this patent is extended or adjusted under 35 U.S.C. 154(b) by 80 days.

(21) Appl. No.: 15/518,983

(22) PCT Filed: Oct. 15, 2015

(86) PCT No.: PCT/CN2015/091970
§ 371 (c)(1),
(2) Date: Apr. 13, 2017

(87) PCT Pub. No.: WO2016/058539
PCT Pub. Date: Apr. 21, 2016

(65) Prior Publication Data
US 2017/0241597 A1    Aug. 24, 2017

(30) Foreign Application Priority Data

Oct. 15, 2014    (CN) .................... 2014 2 0596768 U
Oct. 15, 2014    (CN) .................... 2014 2 0596769 U
(Continued)

(51) Int. Cl.
*F21K 9/232*    (2016.01)
*H01L 33/48*    (2010.01)
(Continued)

(52) U.S. Cl.
CPC .............. *F21K 9/232* (2016.08); *F21K 9/238* (2016.08); *F21K 9/90* (2013.01); *F21V 19/002* (2013.01);
(Continued)

(58) Field of Classification Search
CPC . F21K 9/232; F21K 9/238; F21K 9/90; F21V 29/80; F21V 19/002; F21V 23/001;
(Continued)

(56) References Cited

U.S. PATENT DOCUMENTS 5,927,845 A *   7/1999   Gustafson ............... B64F 1/002
                                                    362/152
6,580,228 B1 *  6/2003   Chen ......................... F21K 9/90
                                                    315/185 R
(Continued)

FOREIGN PATENT DOCUMENTS

CN    103700652 A    4/2014
CN    203659854 U    6/2014
(Continued)

OTHER PUBLICATIONS

International Search Report for corresponding International Application No. PCT/CN2015/091970 dated Jan. 14, 2016 with English translation.
(Continued)

*Primary Examiner* — Bao Q Truong
(74) *Attorney, Agent, or Firm* — Renner, Otto, Boisselle & Sklar, LLP

(57) ABSTRACT

Provided are a substrate used for an LED encapsulation, a three-dimensional LED encapsulation comprising the substrate, a bulb comprising the three-dimensional LED encapsulation and a manufacturing method therefor. The substrate is spiral lines in shape, at least one of the ends of the substrate is provided with an electrode lead wire, the elec-
(Continued)

trode lead wire is connected with the substrate by a connective component and/or connective materials, the spiral lines of the substrate comprise gaps between each other, and a smooth curve and/or a plurality of polylines end to end is formed at least partly at the edge of the substrate. The three-dimensional LED encapsulation and the bulb comprising the three-dimensional LED encapsulation comprise the substrate, multiple LED chips in series and/or parallel are arranged on the substrate, the multiple LED chips are let out by the electrode lead wire of one end of the substrate and the other end of the substrate as the other electrode lead wire. All-dimensional and three-dimensional and multilayer light-emitting of the bulb may be realized, moreover, the heat is easy to dissipate, the structure is simple to manufacture, and the cost is low.

29 Claims, 7 Drawing Sheets

(30) Foreign Application Priority Data

| Oct. 15, 2014 | (CN) | 2014 2 0597293 U |
|---|---|---|
| Oct. 23, 2014 | (CN) | 2014 2 0615380 U |
| Oct. 23, 2014 | (CN) | 2014 2 0616660 U |
| Jan. 16, 2015 | (CN) | 2015 1 0023423 |
| Jan. 16, 2015 | (CN) | 2015 1 0023784 |

(51) Int. Cl.

| H01L 25/075 | (2006.01) |
|---|---|
| F21V 29/80 | (2015.01) |
| F21K 9/238 | (2016.01) |
| F21K 9/90 | (2016.01) |
| F21V 19/00 | (2006.01) |
| F21V 23/00 | (2015.01) |
| H05K 1/02 | (2006.01) |
| F21V 23/06 | (2006.01) |
| F21Y 115/10 | (2016.01) |

(52) U.S. Cl.
CPC ............ *F21V 23/001* (2013.01); *F21V 29/80* (2015.01); *H01L 25/075* (2013.01); *H01L 33/48* (2013.01); *H05K 1/0284* (2013.01); *F21V 23/06* (2013.01); *F21Y 2115/10* (2016.08); *H01L 2924/0002* (2013.01); *H05K 2201/10106* (2013.01)

(58) Field of Classification Search
CPC ....... F21V 23/06; H01L 25/075; H01L 33/48; H01L 2924/0002; H05K 1/0284; H05K 2201/10106; F21Y 2115/10
See application file for complete search history.

(56) References Cited

U.S. PATENT DOCUMENTS

| 6,659,632 | B2 * | 12/2003 | Chen | H05K 1/189 |
| | | | | 362/249.06 |
| 6,866,398 | B2 * | 3/2005 | Lin | F21S 4/26 |
| | | | | 362/244 |
| 8,115,370 | B2 * | 2/2012 | Huang | F21K 9/00 |
| | | | | 313/46 |
| 9,115,858 | B2 * | 8/2015 | Levante | F21V 23/06 |
| 10,066,791 | B2 * | 9/2018 | Zhang | F21K 9/232 |
| 2011/0050073 | A1 * | 3/2011 | Huang | F21K 9/00 |
| | | | | 313/46 |
| 2014/0268740 | A1 * | 9/2014 | Veres | H01L 33/54 |
| | | | | 362/235 |
| 2015/0252956 | A1 * | 9/2015 | Carroll | F21K 9/90 |
| | | | | 362/249.04 |
| 2017/0012177 | A1 * | 1/2017 | Trottier | H01L 25/0753 |

FOREIGN PATENT DOCUMENTS

| CN | 203850336 U | 9/2014 |
| CN | 204176377 U | 2/2015 |
| CN | 204240103 U | 4/2015 |
| CN | 204257694 U | 4/2015 |
| CN | 204268119 U | 4/2015 |
| CN | 104595872 A | 5/2015 |
| CN | 104613346 A | 5/2015 |
| CN | 204424304 U | 6/2015 |

OTHER PUBLICATIONS

Written Opinion of the International Searching Authority for corresponding International Application No. PCT/CN2015/091970 dated Jan. 14, 2016.

* cited by examiner

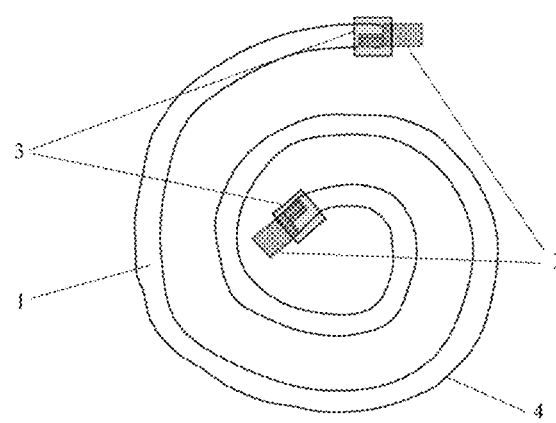
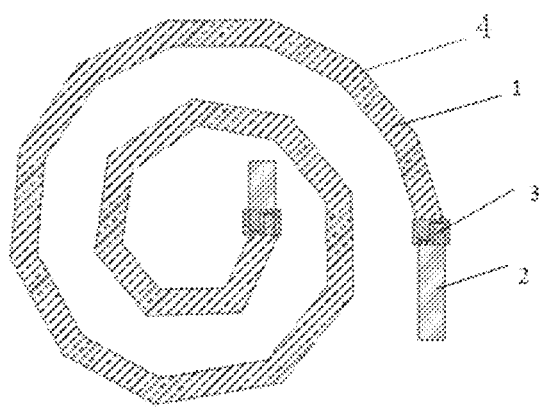
Fig. 1          Fig. 2
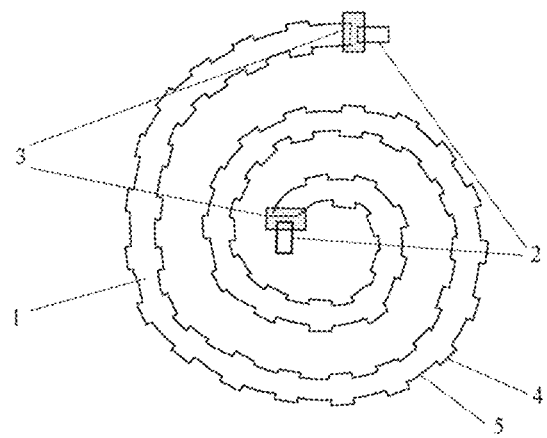
Fig. 3
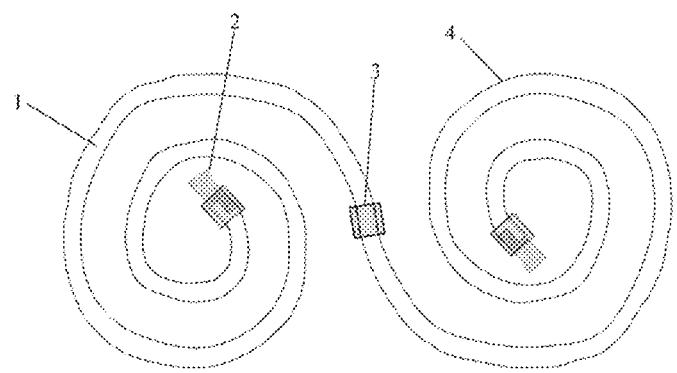
Fig. 4

SUBSTRATE USED FOR LED ENCAPSULATION, THREE-DIMENSIONAL LED ENCAPSULATION, BULB COMPRISING THREE-DIMENSIONAL LED ENCAPSULATION AND MANUFACTURING METHOD THEREFOR

This application is a national phase of International Application No. PCT/CN2015/091970 filed Oct. 15, 2015, and claims priority to CN 201420596769.X filed Oct. 15, 2014, CN 201420597293.1 filed Oct. 15, 2014, CN 201420596768.5 filed Oct. 15, 2014, CN 201420616660.8 filed Oct. 23, 2014, CN 201420615380.5 filed Oct. 23, 2014, CN 201510023784.4 filed Jan. 16, 2015, and CN 201510023423.X filed Jan. 16, 2015.

TECHNICAL FIELD

The present disclosure relates to a substrate for LED encapsulation, three-dimensional LED encapsulation comprising the substrate, a bulb comprising the three-dimensional LED encapsulation. The present disclosure also relates to a manufacturing method for the three-dimensional LED encapsulation and the three-dimensional LED encapsulation bulb.

BACKGROUND

Usually, traditional bulbs are incandescent light bulbs with low illumination and low energy efficiency. After incandescent light bulbs, fluorescent light bulbs with higher illumination and energy efficiency occurred, but fluorescent light bulbs are not environmental-friendly enough due to the use of fluorescent powder. Therefore, LED bulbs now have come into use after the environmental-friendly and energy-saving LED light came out. However, structures and manufacturing process of existing LED bulbs are very complicated. For example, the LED bulb and its manufacturing process disclosed in Chinese Patent CN101509616A comprises a lamp cap, a drive circuit component, a light source holder, a LED light source, and a glass bulb shell; the end of the glass bulb shell is fixedly connected with the lamp cap, the LED light source is fixed on the light source holder, the end of the glass bulb shell is sealed on the end of the light source holder and the LED light source and the light source holder are encompassed within the bulb lumen, the drive circuit components is located in the lamp cap and electrically connected with the lamp cap and LED light source through wires. Although this structure is relatively simple and easy to produce, such a LED bulb cannot achieve the effect of all-directional or three-dimensional glowing because the LED light source in the LED bulb are fixed on the light source holder and has the limitation that the light comes from only one side. To achieve the effect of all-directional or three-dimensional glowing, multiple LED light sources toward different directions usually need to be placed. This will raise the cost and it is difficult to assemble. In particular, cooling will become a problem if many LED light sources are placed in an enclosed bulb.

In addition, the technology of LED encapsulation is very important for the application of LED light source. In the prior art, various LED encapsulation methods include lamp LED encapsulation, Chip-on-Board LED encapsulation, Surface Mount Device LED encapsulation, System-in-Package LED encapsulation, etc. Different methods for LED encapsulation will use different encapsulation substrates.

Among the above, Chip-on-Board LED encapsulation is a popular way of LED encapsulation. Traditionally, the substrate for Chip-on-Board LED encapsulation is made of a circuit board or a single material such as metal, PVC, PMMA, or plastic, etc., and often has the shape of a planar rectangular, a planar circle or a planar strip, etc.

However, existing Chip-on-Board LED encapsulation emits planar light after LED chips are mounted on the substrate and sealed with fluorescent adhesive. Because of the flaw of the design, it is often not uniformly glowing around the illuminant. In addition, when the substrate is made of transparent materials, although the glowing is in 360 degrees, cooling problem often occurs because transparent materials usually have a low coefficient of heat transfer; and when the substrate is made of light-proof materials, such as metal, even if the cooling problem may be ignored, the bulb still cannot glow in all directions because there is no light on the side placing the LED chip.

To sum up, the substrate and bulb for existing Chip-on-Board LED encapsulation face the problem of non-uniform glowing angles, which result in an incompetence of multi-angled and multi-layered glowing. In addition, the substrate and bulb also face the problem of cooling, which influences glowing efficiency.

SUMMARY

To solve the above problems, the present disclosure provides a substrate for Chip-on-Board LED encapsulation, a three-dimensional LED encapsulation having the substrate for encapsulation, and a bulb having the three-dimensional LED encapsulation, the substrate for encapsulation has the effects of uniform glowing, large glow angles, multi-layered glowing, and better cooling efficiency. The present disclosure also provides manufacturing methods for the three-dimensional LED encapsulation and a bulb with the three-dimensional LED encapsulation, respectively.

According to the present disclosure, a substrate for LED encapsulation is provided. The substrate is in the shape of spiral lines as a whole and at least one end of the substrate has an electrode lead wire. The electrode lead wire is connected with the substrate by connective components and/or connective materials. There are gaps between the spiral lines of the substrate, and the edges of the substrate are smooth curve lines and/or polylines formed by a plurality of straight lines.

To ensure the angle of glowing, the spiral lines of the substrate comprise at least half a circle.

Preferably, the material of the substrate may be metal, PMMA, PVC, plastic, sapphire, ceramic or silica gel, or the concatenation and/or nesting of several of the materials.

To make the light more uniform, the edge of the substrate has a plurality of notches, and/or the surface of the substrate is reflective or scattering.

Preferably, the substrate comprises a middle part and edge part clinging to the middle part; or the substrate is concatenated by several components of different materials; or the substrate comprises the substrate body and at least a spot part or a belt part of materials different from that of the substrate body, the spot part or the belt part is nested or connected with the substrate body.

To manufacture more easily, the substrate is made of PCB having circuit layers, or the substrate is made to have one or at least two independent circuit layers, and the circuit layers are welded on the substrate by ultrasonic gold wire or eutectic; and there are welding spots for LED chips on the circuit layers.

Preferably, the substrate is a one-piece single-spiral structure; or is a group of single-spiral structures in one piece wherein there are at least two single-spiral structures; or a group of single-spiral structures jointed by at least two single-spiral structures, wherein there is at least one connective component at the connecting place.

Preferably, connecting the electrode lead wires with the substrate is implemented on the surface of the substrate, there is a heat-conductive insulation layer between the substrate and the wires.

To facilitate connection to the cooling components or wires, the edge of the substrate has fasteners connecting outside cooling components or wires.

For better cooling, when one end of the substrate has a wire, the other end is used as another wire.

The substrate may be a circular spiral or an elliptical spiral.

Preferably, the spiral structure of the substrate is a conical spiral, or an equal circular spiral, or a single spiral whose diameter goes up and then down along its axial direction, or a double-spiral whose diameter goes down and then up along its axial direction.

And the substrate may be smoothly rising polylines or step-shaped polylines, or the combination of the two.

In addition, to solve the technical problem, the present disclosure provides a three-dimensional LED encapsulation including the substrate. There is a plurality of LED chips on the substrate connected in series and/or in parallel, wherein the plurality of LED chips are lead out by electrode lead wires on two ends of substrate or by an electrode lead wire on one end of substrate and another electrode lead wire on another end of substrate.

Preferably, the spiral structure of the substrate is a conical spiral, or an equally-circular spiral, or a single spiral whose diameter goes up and then down along its axial direction, or a double-spiral whose diameter goes down and then up along its axial direction.

Preferably, the LED chips are connected by electric wires; and LED chips and electrode lead wires are connected by electric wires.

Preferably, the substrate is made of PCB having circuit layers; or make one or at least two independent circuit layers on the substrate, and the circuit layers are welded on the substrate by ultrasonic gold wire or eutectic; and there are welding spots for LED chips on the circuit layers. At least one of the positive electrode and negative electrode of the LED chip is connected with the circuit layer by welding spots, and LED chips are connected in series, in parallel, or in serial-parallel through the connection and arrangement of circuit layers.

To glow all around, the LED chips are equally distributed, or unequally distributed, and are mounted on one side or both sides of the substrate.

On the surface of the LED chips and substrate is a glowing or protective dielectric layer. The dielectric layer may be silica gel, epoxy adhesive, LED luminescent powder gel or some combination of them.

Preferably, the LED chips are horizontal, vertical, face-down or white light.

Preferably, the color of the LED chips may be the same, partly the same, or totally different.

In addition, to solve the technical problem, the present disclosure provides a manufacturing method for the three-dimensional LED encapsulation, comprising: making the substrate in the present disclosure, wherein the substrate is overall formed of a planar spiral; placing a plurality of LED chips on the substrate connected in series and/or in parallel; stretching the two ends of the substrate in the opposite direction along its axis and forming a three-dimensional LED encapsulation.

Preferably, the method for three-dimensional LED encapsulation further comprises: covering at least one dielectric layer with the function of protection or glowing on the substrate and LED chips before stretching.

Preferably, connecting the LED chips with electrode lead wires by electric wires, and connecting LED chips with electrode lead wires by electric wires.

Preferably, paint at least one glowing or protective dielectric layer over the cover of the wires.

Preferably, the substrate is made of PCB having circuit layers; or make one or at least two independent circuit layers on the substrate, and the circuit layers is welded on the substrate by ultrasonic gold wire or eutectic; and there are welding spots for LED chips on the circuit layers.

In addition, to solve the technical problem, the present disclosure provides a bulb with the three-dimensional LED encapsulation, comprising: a light-transmitting shell, lead wires in the light-transmitting shell, and at least one the three-dimensional LED encapsulation connecting with the lead wire, wherein the lead wire is connected with the electrode lead wire on the at least one three-dimensional LED encapsulation; a drive and an electric connector, wherein the drive is connected with the lead wire and the electric connector is connected with the drive.

Preferably, lead wires and a core column of the core column exhaust pipe are placed in the light-transmitting shell, wherein the light-transmitting shell is hermetically connected with the core column, forming a sealed space in the light-transmitting shell.

There is a connective structure between the light transmitting bulb and the electric connector which may be plastic, metal, ceramic, bamboo, wood or rubber.

A cooling wire is placed in the light transmitting bulb, wherein the cooling wire connects the core column and the three-dimensional LED encapsulation.

Protective and cooling gas is filled in the light transmitting bulb.

Preferably, the bulb with three-dimensional LED encapsulation comprises: a connective component connecting the cooling supporter with the electric connector.

The cooling supporter may be connected with the electric connector through connective components and the connective components may be rubber, metal, ceramic, bamboo, wood or plastic.

The cooling supporter does not touch the three-dimensional LED encapsulation; and the three-dimensional LED encapsulation is supported by lead wire.

The cooling supporter has high thermal conductivity and is dielectric. This material may achieve the segregation of heat and electric.

The cooling supporter may be make of more than one component.

Preferably, the light-transmitting shell is of type A, type G, type R, type PAR, type T or in candle-like shape. The electric connector is E40, E27, E26, E14 or GU.

In addition, to solve the technical problem, the present disclosure provides a method for bulb with the three-dimensional LED encapsulation, comprising:

1) make a three-dimensional LED in the present disclosure;

2) make a core column with two lead wires and the core column exhaust pipe.

3) connect the electrode lead wire of the three-dimensional LED encapsulation with the lead wire of the core column;

4) put the connected three-dimensional LED encapsulation and core column (30) into the light-transmitting shell, and melt with fire the connective component between the light-transmitting shell and core column to fuse the two parts into one part;

5) vacuumize the light-transmitting shell using the core column exhaust pipe and inflate the light-transmitting shell with gas that may protect the filament and promote its cooling; and then fuse with fire the core column exhaust pipe to form a hermetically sealed shell;

6) connect the drive with the electric connector by the electric lead wire, connect lead wire of the core column with the drive, put the drive in the electric connector and connect the shell with the electric connector.

Preferably, the step 1) and step 2) may be implemented in any sequence, or at the same time.

Preferably, the core column has a cooling wire on it, and the step 3 comprises connecting the cooling wire with the three-dimensional LED encapsulation.

In addition, to solve the technical problem, the present disclosure provides a method for bulb with the three-dimensional LED encapsulation, which is characterized by the following steps:

1) make the three-dimensional LED encapsulation;
2) prepare a cooling supporter with two lead wires;
3) connect the electrode lead wire of the three-dimensional LED encapsulation with the lead wire;
4) put the connected three-dimensional LED encapsulation and cooling supporter into the light-transmitting shell, and connect and fix the light-transmitting shell and the cooling supporter;
5) connect the drive with the electric connector by the electric lead wire and connect lead wire of the core column with the drive;
6) put the drive in the electric connector and connect the cooling supporter with the electric connector directly or through connective components.

Preferably, the step 1) and step 2) may be implemented in any sequence, or at the same time.

Preferably, the cooling supporter has high thermal conductivity and is dielectric.

Preferably, the connective components may be rubber, metal, ceramic, bamboo, wood or plastic.

Preferably, the cooling supporter does not touch the three-dimensional LED encapsulation; and the three-dimensional LED encapsulation is supported by lead wire.

Preferably, the cooling supporter is formed by one or more components.

Compared with existing technology, the advantage of the present disclosure is, the substrate for LED encapsulation, the three-dimensional LED encapsulation, the bulb with the three-dimensional LED encapsulation and its manufacturing method in the present disclosure may make the bulb glow in three-dimensional direction and layered. The present disclosure is also easy to cool, has a larger angle of glowing, a higher light quantity and is easy and cheap to make.

BRIEF DESCRIPTION OF THE DRAWINGS

FIG. 1 is a schematic diagram of the substrate for LED encapsulation of the first embodiment of the present disclosure.

FIG. 2 is a schematic diagram of the substrate for LED encapsulation of the second embodiment of the present disclosure.

FIG. 3 is a schematic diagram of the substrate for LED encapsulation of the third embodiment of the present disclosure.

FIG. 4 is a schematic diagram of the substrate for LED encapsulation of the fourth embodiment of the present disclosure.

DETAILED DESCRIPTION OF THE EMBODIMENTS

Figure 5:
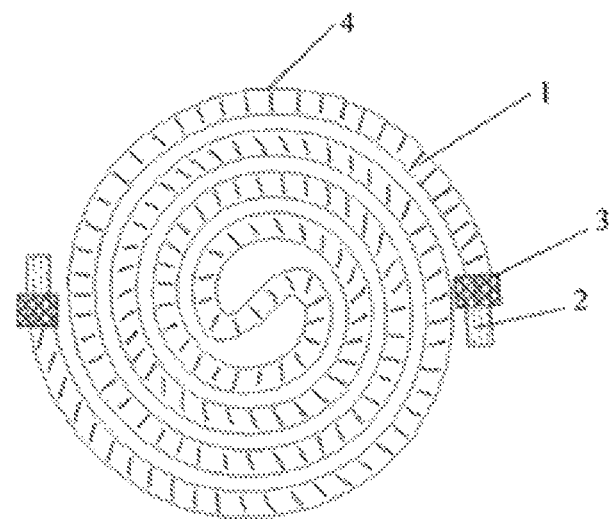
FIG. 5 is a schematic diagram of the substrate for LED encapsulation of the fifth embodiment of the present disclosure.

The present disclosure is further described in details in connection with the embodiments as shown in the figures.

FIGS. 1-10 show substrates for LED encapsulation in several embodiments of the present disclosure. The material of substrate 1 in the present disclosure may be metal, PMMA, PVC, plastic, sapphire, ceramic, or silica gel, or jointing or nesting of several of the materials above.

FIGS. 1-3 show the substrates for LED encapsulation in the first, second, and third embodiments of the present disclosure. The substrate for LED encapsulation comprises substrate 1. The two ends of the substrate 1 have electrode lead wires, and the electrode lead wires 2 are connected with the two ends of the substrate by connective components 3 and/or connective materials. The connective materials may be adhesive, ceramic adhesive, low melting-point glass, silver paste or plastic. As shown in FIGS. 1-3, the electrode lead wires 2 may be connected with substrate 1 by connective components 3. But it may also be that only one end of the substrate 1 has an electrode lead wire 2 and the other end does not have an electrode wire. Instead, the whole substrate is used as another electrode lead wire and is connected with lead wire 31 (not shown in the figure). In this way, cooling of LED chips on the substrate becomes more efficient. Meanwhile, manufacturing becomes easier and the cost of manufacturing is also reduced.

As shown in FIGS. 1-3, the substrates for LED encapsulation are in spiral lines as a whole. A substrate may become three-dimensional as a three-dimensional spiral by stretching the two ends of the substrate in opposite directions along its axis. For the sake of conciseness, unless specified, the term of "spiral" comprises both planar spiral and three-dimensional spiral hereinafter.

As shown in FIGS. 1-3, for easier manufacturing, between the spiral lines of substrate 1 are gaps to let the light go straightly from the LED chips on substrate 1 to the outside instead of being absorbed or reflected. The shape of the substrate in the present disclosure may be a circular spiral, an elliptical spiral, or a spiral in other geometries such as a polygonal spiral including a square, a pentagon, a hexagon spiral, etc. To cope with different three-dimensional LED encapsulation designs, the substrate may be in a regular shape or an irregular shape. The spiral substrate 1 comprises at least half a spiral circle.

The surface of the substrate 1 may be made to be reflective or scattering so that light is difficult to be absorbed by substrate 1 and thus reflected to the outside. As such, light flux is increased and the uniformity of lighting is improved.

When connecting the substrate 1 and the electrode lead wires 2, between them is a heat-conductive dielectric layer. The heat-conductive dielectric layer may effectively conduct heat from substrate to electrode lead wire 2 and will not cause short circuit when using the substrate as a conductive material.

In the embodiment of FIG. 1, edge 4 of substrate 1 is a smooth curve. In the embodiment of FIG. 2, edge 4 of substrate 1 is a polyline formed by a plurality of straight lines connected end to end. The structures in FIGS. 1 and 2 may apply to different three-dimensional LED encapsulations to improve the glowing effect of different three-dimensional LED encapsulations. As shown in the embodiment of FIG. 3, the edge of substrate may have a plurality of notches 5. If the substrate is not transparent, the light may go through the notches and reach the other side of the substrate with no LED chips and thus improve the glowing effect of the three-dimensional LED encapsulation. The shape of notches 5 may be a "U" shape, a "V" shape or other shapes (not shown). The edge of substrate 1 may also be a combination of smooth curves and polylines. Also, edge 4 of the substrate may also have fasteners beyond the edge to connect a cooling wire or lead wires.

FIG. 4 is a schematic diagram of the substrate for LED encapsulation according to the fourth embodiment of the present disclosure. The substrate is a group of single-spiral structures concatenated by at least two single-spiral structures. The two spirals are connected by connective component 3. In addition, the substrate may also be a group of single spirals in one piece (not shown).

Figure 6:
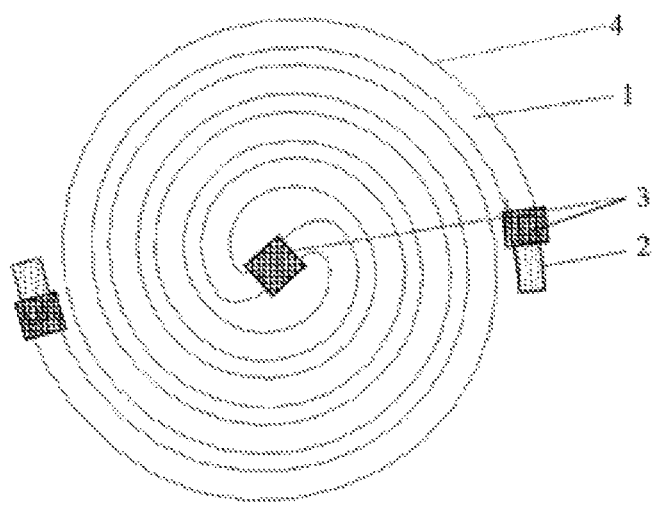
FIG. 6 is a schematic diagram of the substrate for LED encapsulation of the sixth embodiment of the present disclosure.

FIGS. 5 and 6 are schematic diagrams of the substrate for LED encapsulation according to the fifth and sixth embodiments of the present disclosure. The substrate is a one-piece group of double-spiral structure (as shown in FIG. 5), or a group of double-spiral structure connected by connective component 3 (as shown in FIG. 6). Using the substrate for LED encapsulation in the fifth and sixth embodiments of the present disclosure may further make the three-dimensional LED encapsulation glow more uniformly, thereby achieving multi-angled and multi-layered glowing and improving the glowing effect.

Figure 7:
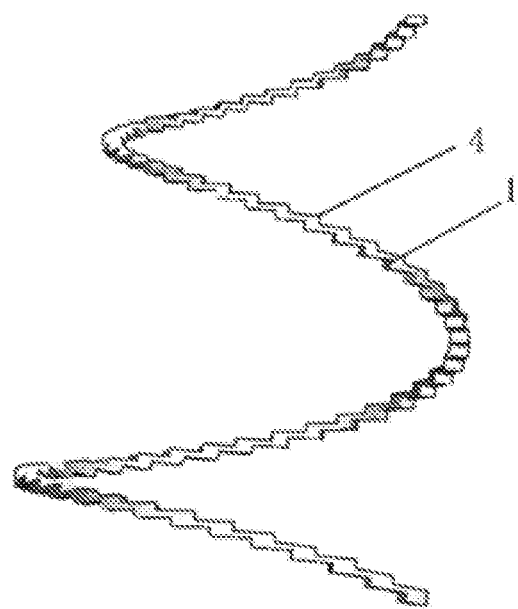
FIG. 7 is a schematic diagram of the substrate for LED encapsulation of the seventh embodiment of the present disclosure.

FIG. 7 is a schematic diagram of the substrate for LED encapsulation according to the seventh embodiment of the present disclosure. The substrate may be smoothly-rising polylines or step-shaped polylines, or the combination of the two. As shown in FIG. 7, the edge of spiral substrate 1 is in a step-shaped polyline and the substrate, viewed from the side, is in a step-shaped spiral structure, that is, a step-shaped polyline formed by folding and stamping. The structure may be three-dimensional LED encapsulated directly, which looks fashion and beautiful and is popular among users.

Figure 8:
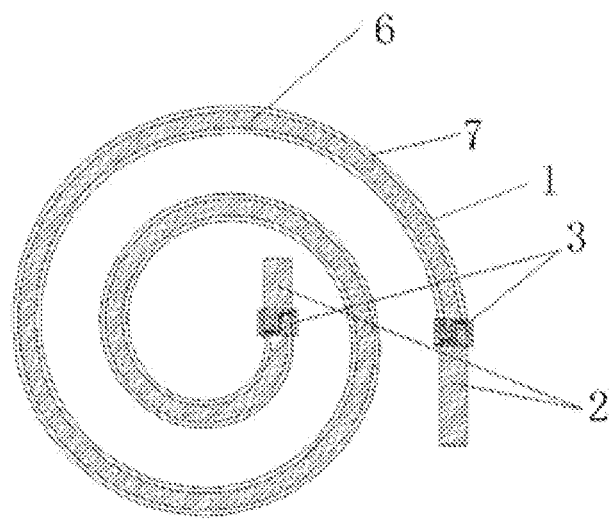
FIG. 8 is a schematic diagram of the substrate for LED encapsulation of the eighth embodiment of the present disclosure.

As shown in FIG. 8, the substrate comprises a middle part 6 and edge parts 7 clinging to the middle, which may be made of different materials. For example, the middle part 6 may be one material of metal, PMMA, PVC, plastic, sapphire, ceramic or silica gel, and the edge part 7 may be another material of metal, PMMA, PVC, plastic, sapphire, ceramic or silica gel. Preferably, the middle part 6 may be metal and the edge part 7 may be transparent silica gel. LED chips may be mounted on substrate 1 using common encapsulation method to let the light of LED chips go through the edge part 7 and reach the back of substrate 1 so as to make the light more uniform. In addition, LED chips may be mounted on middle part 6 or edge part 7 or near edge part 7. Similarly, the substrate may be a concatenation of several different materials to make it diversified. For example, one part is metal, another part is PMMA, and then a subsequent part is ceramic, etc. Such a combination diversifies appearance of the substrate and improves cooling, encapsulation, and manufacturing. Moreover, the intensity of light may be designed based on the difference in density of the materials to meet the requirements, thereby making light of the entire lamp more uniform, which is beneficial to the uniformity of illuminance.

Figure 9:
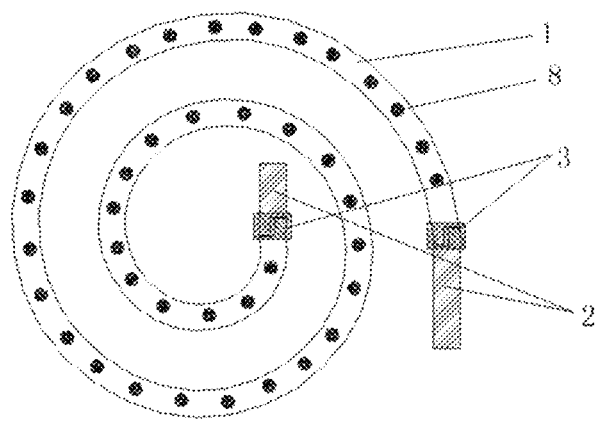
FIG. 9 is a schematic diagram of the substrate for LED encapsulation of the ninth embodiment of the present disclosure.

As shown in FIG. 9, based on the ninth embodiment of the present disclosure, substrate 1 comprises the substrate body and a group of spots 8 of different materials concatenated or nested on the substrate body. The spots 8 may be replaced by belts 8. The spots 8 may be circular, elliptical, triangle, square, pentagon, hexagon or other shape. If replaced by belts, they may be belts or quadrangles with larger area. To be specific, the substrate itself may be any of metal, PMMA, PVC, plastic, sapphire, ceramic or silica gel, and the spots or belts are of another material mentioned above. For example, the substrate is metal, the spots are transparent silica gel which help the light go from the upper side of the substrate to the down side and make the glow more uniform. LED chips may be mounted on spots 8 or on the belts, or on other places on the substrate.

Figure 10:
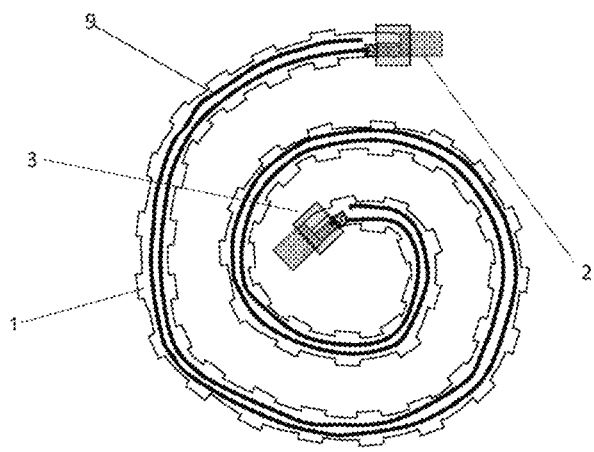
FIG. 10 is a schematic diagram of the substrate for LED encapsulation of the tenth embodiment of the present disclosure.
Figure 11:
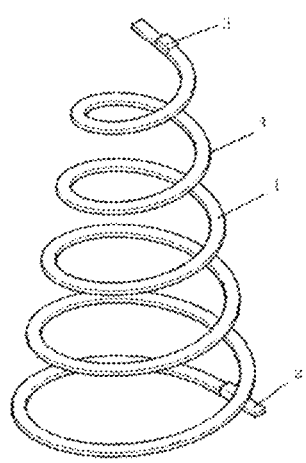
FIG. 11 is a schematic diagram of a three-dimensional spiral line substrate formed by stretching the two ends in opposite directions.

FIG. 10 is a schematic diagram of the substrate for LED encapsulation of the tenth embodiment of the present disclosure. There is one or at least two independent circuit layers 9. The circuit layers 9 are welded on the substrate 1 by ultrasonic gold wire or eutectic; and there are welding spots for LED chips on the circuit layers 9. It should be noted that there are other methods to fix circuit layers 9 on the substrate.

The substrate may be made of PCB having circuit layers directly.

Based on the present disclosure, the length of the spiral substrate 1 is 5 mm-1000 mm, the width is 0.1 mm-50 mm and the thickness is 0.01 mm-10 mm, which make it easier to put the substrate in the bulb. It should be noted that in other situation, other size may be applied and belongs to the scope of protection of the present disclosure.

Figure 12:
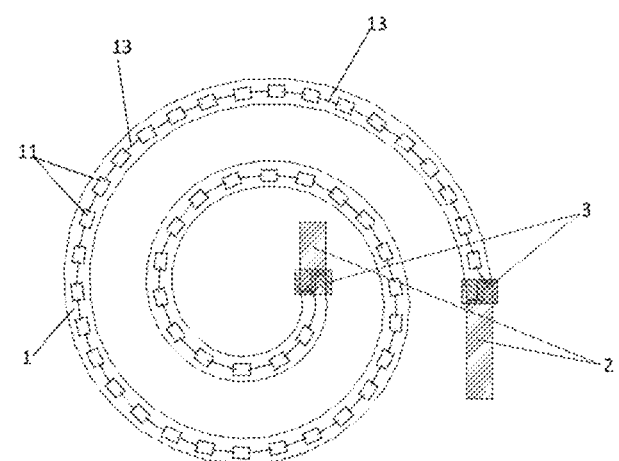
FIG. 12 is a schematic diagram of the LED encapsulation having the substrate of the first embodiment of the present disclosure.
Figure 13:
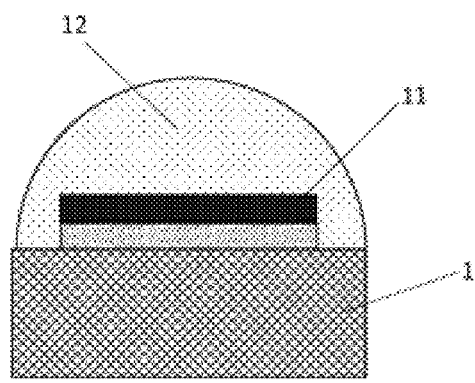
FIG. 13 is a sectional view of the three-dimensional LED encapsulation of FIG. 12.

FIG. 12 is a schematic diagram of the LED encapsulation with the substrate of the first embodiment of the present disclosure. FIG. 13 is the section view of the LED encapsulation of FIG. 12. As shown in the figures, the substrate 1 has a plurality of LED chips 11 connected in series and/or in parallel. The LED chips 11 are connected by electric wires 13 and LED chips and electrode lead wires are connected by electric wires 13. LED chips 11 are fixed on substrate 1 by non-conductive gel (like silica gel, modified resin or epoxy resin), or conductive gel (like silver gel or copper gel). The LED chips 11 and the substrate 1 are covered with a dielectric layer 12 with the function of protection or glowing, as shown in FIG. 13. The dielectric layer 12 is one of or the combination of silica gel, epoxy resin gel or LED lightening gel. The dielectric layer 12 may be mounted only on the surface of the substrate with LED chips 11 and electric wires 13, or on the plane of the substrate with LED chips 11 and electric wires 13 and the two side planes, or on all planes of the substrate. For example, when there are fastener beyond the edge 4 of the substrate, dielectric 12 does not need to cover the fastener.

FIGS. 12 and 13 show the three-dimensional LED encapsulation with the substrate according to the first embodiment of the present disclosure. But the three-dimensional LED encapsulation may be made of other forms of substrates in the present disclosure.

In addition, the substrate for LED encapsulation according to the tenth embodiment of the present disclosure is shown in FIG. 10, because the spiral substrate 1 may be welded on the substrate by ultrasonic gold wire or eutectic or made of PCB directly (there are welding spot on the circuit layer on the PCB), LED chips 11 may be connected with the circuit layer through the welding spot and increase the kinds of LED chips. The LED chips are horizontal, vertical, face-down or white light. To be specific, if vertical chips are used, the positive pole connects with the circuit layer through the welding spot and the negative pole connects with the circuit layer through electric wire 13. If face-down chips are used, the positive and negative poles are all connect with the circuit layer through welding spots. If white light chips are used, no protective or glowing dielectric layer is needed on LED chips, electric wires and the surface of the substrate because the white light chip itself have a dielectric layer being protective and/or glowing.

In the LED encapsulation of the embodiment shown by FIGS. 12 and 13, the colors of LED chips 11 may be the same, different or partially different. For example, they may all be blue light, UV-light or other monochromatic light, or mixed light of different colors, or white light with high color rendering index.

Based on the present disclosure, the LED chips are equally distributed, or unequally distributed, and are mounted on one side or both sides of the substrate. For example, when the axis of the three-dimensional spiral of the substrate of the present disclosure is vertical, LED chips are dense in the upper part of the substrate and are sparse in the lower part of the substrate. This will increase the light intensity of the middle part. Both sides of substrate 1 may place LED chips and this will make the light more uniform. In addition, the LED encapsulation shown in FIGS. 12 and 13 may be three-dimensional spiral, that is, the three-dimensional LED encapsulation may be double-spiral or single-spiral, the shape of which is determined by the shape of substrate 1.

The method of making three-dimensional LED encapsulation according to the present disclosure comprises: prepare a substrate in FIGS. 1-6, 8-10, place a plurality of LED chips 11 connected in series and/or in parallel on the substrate 1, stretch the two ends of the substrate in the opposite directions along its axis to form a three-dimensional LED encapsulation.

Wherein the method for three-dimensional LED encapsulation further comprises: cover the surface of substrate 1 and LED chips 11 with a protective or glowing dielectric layer 12 before stretching.

Wherein electric wires may be used between the LED chips 11, and LED chips and electrode lead wire. The surface of the electric wires may be covered with a protective or glowing dielectric layer.

Or, when there are welding spots on circuit layer 9 on the substrate, at least one of the positive pole and negative pole of LED chips 11 on the substrate is electrically connected with circuit layer 9 and are connected in series, in parallel, or in serial-parallel through the connection and arrangement of circuit layers.

The spiral structure of the substrate is a conical spiral, or an equal circular spiral, or a single spiral whose diameter goes up and then down along its axial direction, or a double-spiral whose diameter goes down and then up along its axial direction.

Figure 14:
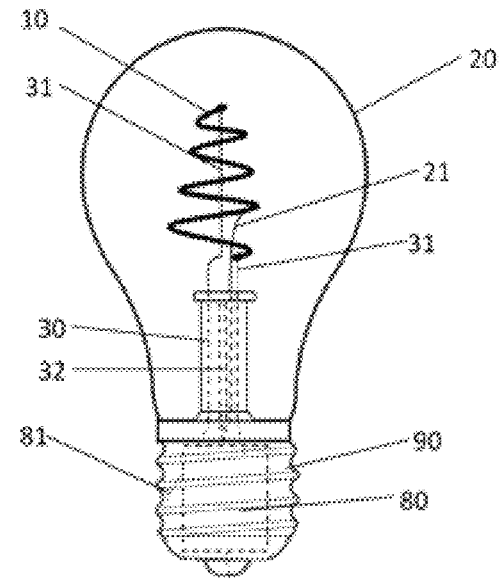
FIG. 14 is a schematic diagram of a bulb having the three-dimensional LED encapsulation in one embodiment.

FIG. 14 is a schematic diagram of a bulb with the three-dimensional LED encapsulation in the embodiment. The bulb comprises a light-transmitting shell 20, lead wires 31 in the light-transmitting shell, a core column 30 of the core column exhaust pipe 32 and at least one the three-dimensional LED encapsulation 10 connecting with the lead wire 31. Based on the present disclosure, the electrode wire on the substrate for three-dimensional LED encapsulation 10 is connected with electric connector 90 through lead wire 31, drive 80 and drive electric lead wire 81, to connect with the external power source to lit the LED chips. The light-transmitting shell 20 is connected with the core column 30, forming a sealed space in the light-transmitting shell 20, filled with protective and cooling gas which may be helium or hydrogen-helium mixture. The transmitting shell 20 is transparent, milky white, dull polished, or color covered, or partially reflective, or covered partly with small prism or small lens. The shape of the transmitting bulb shell 20 may be in "A", "G", "R", "PAR", "T" shapes, candle-like or in other shapes of existing bulb shells. The electric connector 90 may be E40, E27, E26, E14, GU or other existing electric connector. There is a cooling wire 21 in the light transmitting bulb 20, wherein the cooling wire 21 connects the core column 30 and the three-dimensional LED encapsulation 10 to conduct the heat to core column 30 and to the external environment.

The three-dimensional LED encapsulation in the bulb may be a conical spiral, as shown in 14, which may be connected to operate AC or DC. When the three-dimensional LED encapsulation is operating DC, it may use external DC power or AC power; when using external AD power, the drive 80 may be made of a circuit for limiting current and lowing voltage with a capacitor and a resistance connected in parallel, and a rectifier and filter circuit. The circuit of drive 80 may be simple and low-cost, with no use of electrolytic capacitor, transistor, transformer, or high-frequency radiation. It may also be a switcher, a power source and a constant current stabilizer.

The method of making the bulb with three-dimensional LED encapsulation of the present disclosure comprises:

1) make the three-dimensional LED;

2) make a core column 30 with two lead wires 31 and the core column exhaust pipe 32;

3) connect the electrode lead wire 2 of the three-dimensional LED encapsulation with the lead wire 31 of the core column 30;

4) put the connected three-dimensional LED encapsulation and core column 30 into the light-transmitting shell 20, and melt the connective component between the light-transmitting shell 20 and core column 30 to fuse the two part as a whole;

5) vacuumize the light-transmitting shell 20 using the core column exhaust pipe 32 and inflate light-transmitting shell 20 with gas that may protect the filament and promote its cooling; and then fuse the core column exhaust pipe 32 to form a hermetically sealed shell;

6) connect the drive 80 with the electric connector 90 by the electric lead wire 81, connect lead wire 31 of the core column with the drive 80, put the drive 80 in the electric connector 90 and connect the shell with the electric connector 90;

The step 1) and step 2) may be implemented in any sequence, or at the same time.

Wherein the inflating is to inflate the transmitting shell 20 with gas that is protective and hear conductive to the filament.

Wherein the core column 30 has a cooling wire 21 on it, and the step 3 comprises connecting the cooling wire 21 with the three-dimensional LED encapsulation 10.

Figure 15:
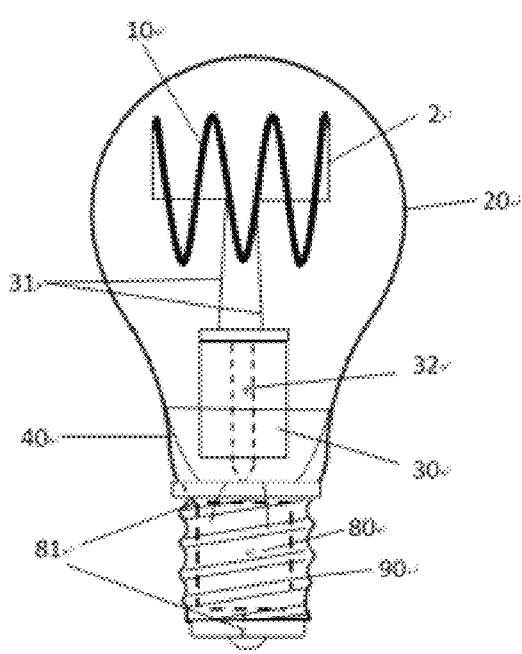
FIG. 15 is a schematic diagram of a bulb having the three-dimensional LED encapsulation in another embodiment.

As shown in FIG. 15, another embodiment of the present disclosure is different from the bulb above because substrate 1 of the three-dimensional LED encapsulation in the bulb is an equal circular spiral and is placed horizontally. And there is a connective structure 40 between transmitting shell 20 and electric connector 90 which is plastic, metal, ceramic, bamboo or rubber. Connective structure 40 may enlarge the neck of the bulb and place larger filament or light bar in the bulb, and may enlarge the volume of the shell to help conduct heat.

Figure 16:
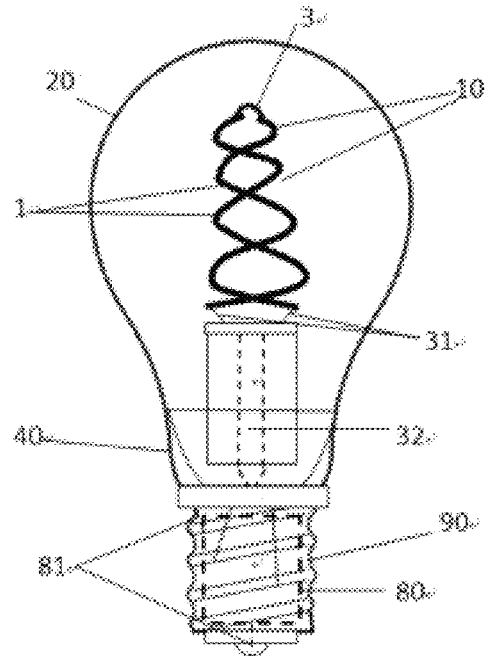
FIG. 16 is a schematic diagram of a bulb having the three-dimensional LED encapsulation in another embodiment.
Figure 17A:
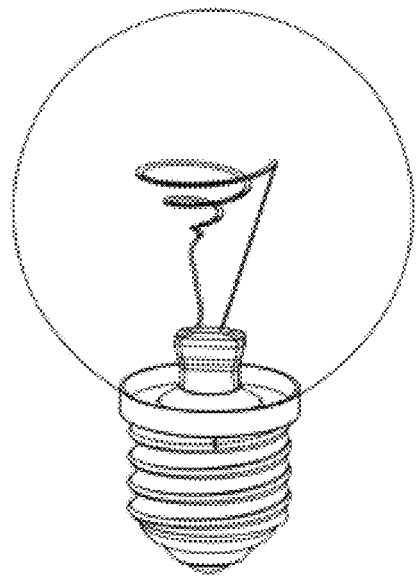
FIG. 17a-17d are schematic diagrams of bulbs having the three-dimensional LED encapsulation in some embodiments.
Figure 17B:
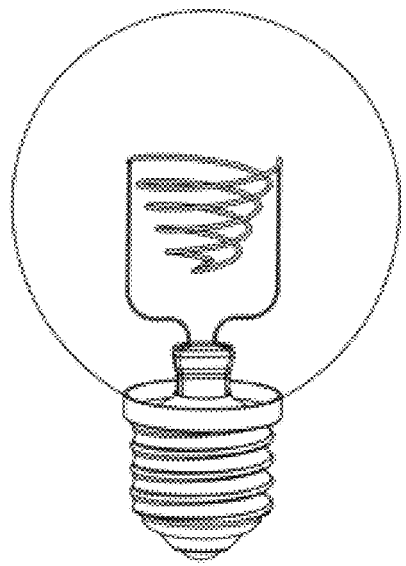
Figure 17C:
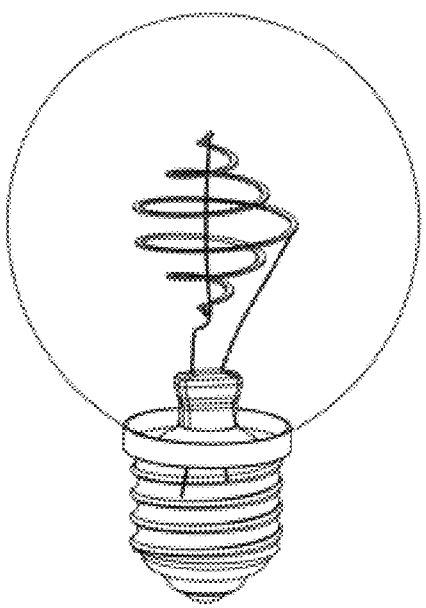
Figure 17D:
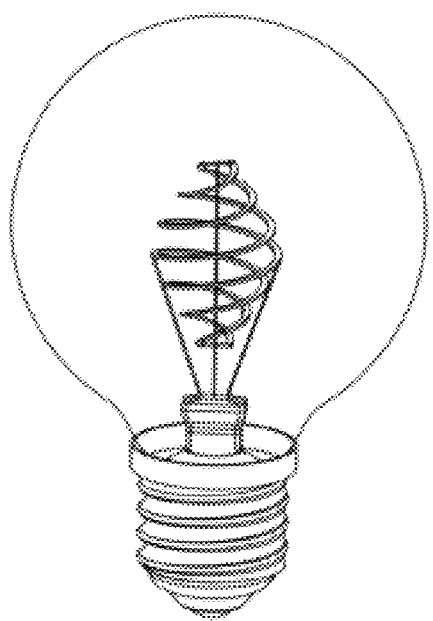

As shown in FIG. 16, another embodiment of the present disclosure is different from the bulb above because there are two spiral three-dimensional LED encapsulations 10, forming a double-spiral. The positions of the two spirals may be opposite, back-to-back, face-to-face, or staggered. The number of turns of the two spirals may be the same or different. FIGS. 17a-17d are schematic diagrams of a bulb with the three-dimensional LED encapsulation in some embodiments. FIG. 17a is a single spiral whose diameter goes up along its axial direction. FIG. 17b is a double-spiral whose diameter goes up along its axial direction. FIG. 17c is a single spiral whose diameter goes up and then down along its axial direction. FIG. 17d is a double-spiral whose diameter goes down and then up along its axial direction.

Figure 18:
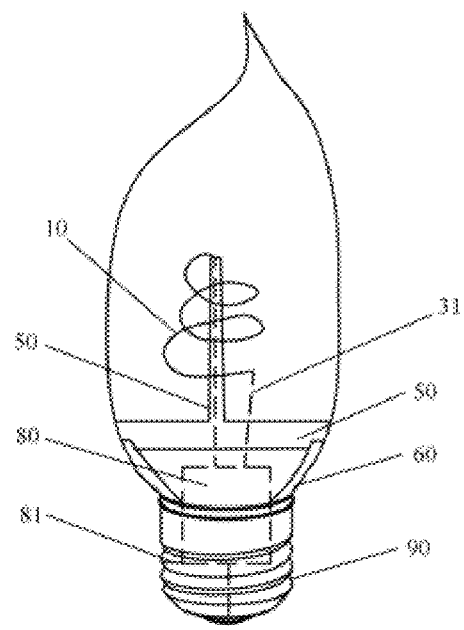
FIG. 18 is a schematic diagram of a bulb having the three-dimensional LED encapsulation in another embodiment.

FIG. 18 is schematic diagram of a bulb with the three-dimensional LED encapsulation in another embodiment. The bulb comprises a cooling supporter 50, lead wires 31 and at least one spiral three-dimensional LED encapsulation 10, wherein one lead wire 31 is in the cooling supporter 50 and the two ends of the at least one spiral three-dimensional LED encapsulation 10 are connected with a lead wire from cooling supporter 50 and another lead wire 31 respectively. The transmitting shell and cooling supporter 50 may be connected with electric connector 90 directly (not shown in the figure) or through connective structural component 60. Lead wire 31 is connected with drive 80 which is mounted in connective structural component 60 and electric connector 90. Connective structural component 60 may be plastic, metal, ceramic, bamboo or rubber. Cooling supporter 50 has high thermal conductivity and is dielectric (to make electrically neutral thermal path). In this way, heat may be conducted from spiral three-dimensional LED encapsulation 10 to connective structural component 60. The cooling supporter 50 may be whole formed or form by one or more components. the material of each component may be the same, partial same or different.

Figure 19:
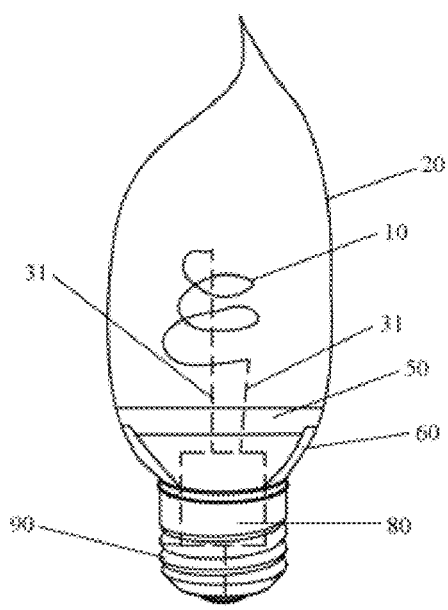
FIG. 19 is a schematic diagram of a bulb having the three-dimensional LED encapsulation in another embodiment.

FIG. 19 is schematic diagram of a bulb with the three-dimensional LED encapsulation 10 in another embodiment. The bulb in this embodiment is much similar with that in FIG. 18. The difference is, cooling supporter 50 does not touch the three-dimensional LED encapsulation; and the three-dimensional LED encapsulation 10 is supported by lead wires 31. In this way, two lead wires 31 support the three-dimensional LED encapsulation 10 and conduct heat and electricity. The lead wires conduct heat from three-dimensional LED encapsulation to cooling supporter 50 and connective structural component 60.

Based on bulbs in FIGS. 18 and 19, the structures are formed only by the transmitting shell, lead wires and the electric connector. Because the cooling supporter and two lead wires 31 may conduct heat well, there is no need to seal, vacuumize and fuse the bulbs.

The method for bulbs with three-dimensional LED encapsulation in FIGS. 18 and 19 comprises:

1) make the three-dimensional LED encapsulation;

2) prepare a cooling supporter 50 with two lead wires 31;

3) connect the electrode lead wire 2 of the three-dimensional LED encapsulation with the lead wire 31;

4) put the connected three-dimensional LED encapsulation and cooling supporter 50 into the light-transmitting shell 20, and connect and fix the light-transmitting shell 20 and the cooling supporter 50;

5) connect the drive 80 with the electric connector 90 by the electric lead wire (81) and connect lead wire 31 of the core column with the drive 80;

6) put the drive 80 in the electric connector 90 and connect the cooling supporter 50 with the electric connector 90 directly or through connective components 60;

Wherein the step 1) and step 2) may be implemented in any sequence, or at the same time.

Wherein cooling supporter 50 has high thermal conductivity and is dielectric to make electrically neutral thermal path, like APL.

The connective structural component 60 is made or plastic, metal, ceramic, bamboo or rubber.

Wherein the three-dimensional LED encapsulation is fixedly connected with the cooling supporter 50, and may support the three-dimensional LED encapsulation with cooling supporter 50; or the cooling supporter 50 does not touch the three-dimensional LED encapsulation and the three-dimensional LED encapsulation is supported by lead wires 31.

The cooling supporter 50 may be in one piece, or made of more than one component as described above.

According to the present disclosure, the bulb may be all-directional, three-dimensional, and multi-layer glowing. The bulb is also heat conductive, large in glowing angle, and uniform in light intensity. In addition, the manufacturing process is simple, convenient, and low-cost.

The invention claimed is:

1. A substrate for LED encapsulation, wherein:
said substrate is in spiral lines as a whole about a spiral axis, at least one end of said substrate has an electrode lead wire, and said electrode lead wire is connected with said substrate by connective components and/or connective materials;
there are gaps between the spiral lines of said substrate, and edges of said substrate are at least partially smooth curves;
said substrate having a first major surface and an opposing second major surface, the first major surface and the second major surface being approximately perpendicular to the spiral axis, said substrate comprising a middle part and lateral edge parts bounding the middle part, the lateral edge parts are made of a transparent material that is different from the material of the middle part, and an upper surface of the lateral edge parts and an upper surface of the middle part together forming the first major surface of the substrate; or said substrate comprises the substrate body and at least a spot part or a belt part in a material different from the material of the substrate body, the spot part or the belt part being nested or connected with the substrate body, and the spot part or the belt part being made of a transparent material, wherein an upper surface of the spot part or belt part and an upper surface of the substrate body together form the first major surface of the substrate.

2. A three-dimensional LED encapsulation, comprising said substrate in claim 1, wherein:
a plurality of LED chips connected in series and/or in parallel are placed on said substrate;
said a plurality of LED chips are led out by electrode lead wires on two ends of substrate, or by an electrode lead wire on one end of substrate and the other end of substrate which serves as another electrode lead wire.

3. The three-dimensional LED encapsulation in claim 2, wherein:
the spiral structure of said substrate is a conical spiral, or an equally-circular spiral, or a single-spiral structure of which the diameter goes up and then down along its axial direction, or a double-spiral structure of which the diameter goes down and then up along its axial direction.

4. The three-dimensional LED encapsulation in claim 2, wherein:
said LED chips are connected by electric wires; and LED chips and electrode lead wires are connected by electric wires.

5. The three-dimensional LED encapsulation in claim 2, wherein:
said substrate is directly made of a PCB having circuit layers; or
said substrate is made to have one or at least two independent circuit layers, and said circuit layer is welded on the substrate by ultrasonic gold wire or eutectic; and there are welding spots for LED chips on said circuit layers;
at least one of the positive electrode and negative electrode of the LED chips is connected with the circuit layer by welding spots, and LED chips are connected in series, in parallel, or in serial-parallel through connection and arrangement of circuit layers.

6. The three-dimensional LED encapsulation in claim 2, wherein:
said LED chips and said substrate are covered with a dielectric layer having the function of protection or glowing.

7. A method of making three-dimensional LED encapsulation, wherein:
making the substrate as described in claim 1, to make the substrate generally being a planar-spiral shape;
placing on said substrate a plurality of LED chips in a form of connection in series and/or in parallel;
stretching the two ends of said substrate in opposite directions along its axis to form a three-dimensional LED encapsulation.

8. The method in claim 7, wherein, further comprising:
covering at least one dielectric layer having the function of protection or glowing on said substrate and LED chips before the stretching.

9. The method in claim 7, wherein:
connecting said LED chips by electric wires, and connecting LED chips with electrode lead wires by electric wires.

10. The method in claim 7, wherein:
said substrate is made of a PCB having circuit layers; or
said substrate is made to have one or at least two independent circuit layers, and said circuit layers is welded on the substrate by ultrasonic gold wire or eutectic; and there are welding spots for LED chips on said circuit layers,
at least one of the positive electrode and negative electrode of the LED chips is connected with the circuit layers by welding spots, and LED chips are connected in series, in parallel, or in serial-parallel through connection and arrangement of circuit layers.

11. A light bulb with the three-dimensional LED encapsulation in claim 2, wherein, comprising:
a light-transmitting shell, wherein lead wires are placed in said light-transmitting shell, and at least one of said three-dimensional LED encapsulation being connected with said lead wire, wherein the lead wire is connected with the electrode lead wire on said at least one three-dimensional LED encapsulation; and
a drive and an electric connector, wherein said drive is connected with said lead wire and said electric connector is connected with the drive.

12. The light bulb in claim 11, wherein:
a core column having lead wires and core column exhaust pipe is placed in said light-transmitting shell, wherein said light-transmitting shell is hermetically connected with the core column, forming a sealed space in the light-transmitting shell.

13. The light bulb in claim 12, wherein:
a connective structure is placed between said light-transmitting shell and the electric connector.

14. The light bulb in claim 12, wherein:
a cooling wire is placed in said light-transmitting shell, wherein said cooling wire is arranged between the core column and the three-dimensional LED encapsulation.

15. The light bulb in claim 11, wherein:
a cooling supporter is placed in the light-transmitting shell, the cooling supporter being connected to the light-transmitting shell, wherein said cooling supporter is connected with the electric connector.

16. The light bulb in claim 15, wherein:
the cooling supporter is connected with the electric connector by a connective component.

17. The light bulb in claim 15, wherein:
said cooling supporter does not touch the three-dimensional LED encapsulation; and said three-dimensional LED encapsulation is supported by lead wire.

18. A method of making a bulb with a three-dimensional LED encapsulation, wherein, comprising the following steps:
1) making a three-dimensional LED encapsulation as described in claim 2;
2) making a core column with two lead wires and the core column exhaust pipe;
3) connecting the electrode lead wires of said three-dimensional LED encapsulation with the lead wires of the core column;
4) putting the connected three-dimensional LED encapsulation and core column into the light-transmitting shell, and melting with fire the connective component between the light-transmitting shell and core column to fuse the two part into one part;
5) vacuuming the light-transmitting shell using the core column exhaust pipe, inflating the light-transmitting shell with gas that can protect the filament and promote its cooling; and then fusing with fire the core column exhaust pipe to form a hermetically sealed shell;
6) connecting the drive with the electric connector by the electric lead wire, connecting lead wires of the core column with the drive, putting the drive in the electric connector, and connecting the shell with the electric connector;
wherein said step 1) and step 2) can be implemented in any sequence, or at the same time.

19. The method of making the bulb in claim 17, wherein:
said core column has a cooling wire on it, and said step 3) further comprises connecting said cooling wire with the three-dimensional LED encapsulation.

20. The method of making a bulb with a three-dimensional LED encapsulation, wherein, comprising the following steps:
1) making a three-dimensional LED encapsulation as described in claim 2;
2) preparing a cooling supporter having two lead wires;
3) connecting the electrode lead wires of said three-dimensional LED encapsulation with said lead wires;
4) putting the three-dimensional LED encapsulation and cooling supporter into the light-transmitting shell, and connecting and fixing the light-transmitting shell and the cooling supporter;
5) connecting the drive with the electric connector by the electric lead wire and connecting lead wires with the drive;
6) putting the drive in the electric connector and connecting the cooling supporter with the electric connector directly or through connective components;
wherein said step 1) and step 2) can be implemented in any sequence, or at the same time.

21. The method of making a bulb in claim 20, wherein:
said cooling supporter does not touch the three-dimensional LED encapsulation; and said three-dimensional LED encapsulation is supported by lead wires.

22. The substrate in claim 1, wherein:
the edges of said substrate have a plurality of notches, and/or the surface of said substrate is reflective or scattering.

23. The substrate in claim 1, wherein:
said substrate is made of a PCB having circuit layers; or
said substrate is made to have one or at least two independent circuit layers, and said circuit layer is welded on the substrate by ultrasonic gold wire or eutectic; and
there are welding spots for LED chips on said circuit layer.

24. The substrate in claim 1, wherein:
said substrate is a one-piece single-spiral structure; or is a group of single-spiral structures in one piece having at least two single-spiral structures; or a group of single-spiral structures jointed by at least two single-spiral structures, wherein there is at least one connective component at the connecting place.

25. The substrate in claim 1, wherein:
the edge of said substrate has fasteners connecting outside cooling components or lead wires.

26. The substrate in claim 1, wherein:
when one end of the substrate has an electrode lead wire, the other end of the substrate is used as another electrode lead wire.

27. The substrate in claim 1, wherein:
said LED chips are equally distributed, or unequally distributed, and are mounted on one side or both sides of the substrate.

28. The substrate in claim 1, wherein:
the colors of said LED chips may be same, partly same, or totally different.

29. The substrate in claim 1, wherein:
said substrate is in shape of smoothly-rising polyline, or step-shaped polyline, or a combination thereof.

* * * * *